United States Patent
Gann et al.

(10) Patent No.: US 8,012,803 B2
(45) Date of Patent: Sep. 6, 2011

(54) VERTICALLY STACKED PRE-PACKAGED INTEGRATED CIRCUIT CHIPS

(75) Inventors: Keith Gann, Tustin, CA (US); Douglas M. Albert, Yorba Linda, CA (US)

(73) Assignee: Aprolase Development Co., LLC, Wilmington, DE (US)

( * ) Notice: Subject to any disclaimer, the term of this patent is extended or adjusted under 35 U.S.C. 154(b) by 0 days.

(21) Appl. No.: 12/891,439

(22) Filed: Sep. 27, 2010

(65) Prior Publication Data
US 2011/0045635 A1 Feb. 24, 2011

Related U.S. Application Data

(60) Division of application No. 10/968,572, filed on Oct. 19, 2004, now Pat. No. 7,872,339, which is a continuation of application No. 10/128,728, filed on Apr. 22, 2002, now Pat. No. 6,806,559.

(51) Int. Cl.
*H01L 21/00* (2006.01)
(52) U.S. Cl. ............... 438/109; 257/686; 257/E25.027
(58) Field of Classification Search ............... 438/109; 257/686, E25.027
See application file for complete search history.

(56) References Cited

U.S. PATENT DOCUMENTS

| | | |
|---|---|---|
| 3,370,203 A | 2/1968 | Kravitz et al. |
| 4,288,841 A | 9/1981 | Gogal |
| 4,597,519 A | 7/1986 | Kurtz et al. |
| 4,706,166 A | 11/1987 | Go |
| 4,764,846 A | 8/1988 | Go |
| 4,966,867 A | 10/1990 | Crotti et al. |
| 5,104,820 A | 4/1992 | Go |
| 5,107,586 A | 4/1992 | Eichelberger et al. |
| 5,281,852 A | 1/1994 | Normington |
| 5,400,218 A | 3/1995 | Val |
| 5,424,920 A | 6/1995 | Miyake |
| 5,544,804 A | 8/1996 | Test et al. |
| 5,608,265 A | 3/1997 | Kitano et al. |
| 5,677,566 A | 10/1997 | King et al. |
| 5,801,448 A | 9/1998 | Ball |
| 5,834,832 A | 11/1998 | Kweon et al. |
| 5,835,988 A | 11/1998 | Ishii |

(Continued)

FOREIGN PATENT DOCUMENTS
EP 644547 3/1995
(Continued)

OTHER PUBLICATIONS

Advisory Action issued in U.S. Appl. No. 10/968,572 and mailed on Mar. 29, 2010.

(Continued)

*Primary Examiner* — Bradley K Smith
*Assistant Examiner* — Mohammad T Karimy

(57) ABSTRACT

Prepackaged chips, such a memory chips, are vertically stacked and bonded together with their terminals aligned. The exterior lead frames are removed including that portion which extends into the packaging. The bonding wires are now exposed on the collective lateral surface of the stack. In those areas where no bonding wire was connected to the lead frame, a bare insulative surface is left. A contact layer is disposed on top of the stack and vertical metalizations defined on the stack to connect the ends of the wires to the contact layer and hence to contact pads on the top surface of the contact layer. The vertical metalizations are arranged and configured to connect all commonly shared terminals of the chips, while the control and data input/output signals of each chip are separately connected to metalizations, which are disposed in part on the bare insulative surface.

36 Claims, 3 Drawing Sheets

U.S. PATENT DOCUMENTS

| | | | |
|---|---|---|---|
| 5,857,858 | A | 1/1999 | Gorowitz et al. |
| 5,885,850 | A | 3/1999 | Val |
| 6,072,234 | A | 6/2000 | Camien et al. |
| 6,084,175 | A | 7/2000 | Perry et al. |
| 6,172,423 | B1 | 1/2001 | Lee |
| 6,338,973 | B1 | 1/2002 | Terrill |
| 6,380,624 | B1 | 4/2002 | Hung |
| 6,545,228 | B2 | 4/2003 | Hashimoto |
| 6,560,109 | B2 | 5/2003 | Yamaguchi et al. |
| 6,611,052 | B2 | 8/2003 | Poo et al. |
| 6,627,984 | B2 | 9/2003 | Bruce et al. |
| 6,650,013 | B2 | 11/2003 | Yin et al. |
| 6,674,161 | B1 | 1/2004 | Haba |
| 6,706,971 | B2 | 3/2004 | Albert et al. |
| 6,710,246 | B1 | 3/2004 | Mostafazadeh et al. |
| 6,716,672 | B2 | 4/2004 | Val |
| 6,784,547 | B2 | 8/2004 | Pepe et al. |
| 6,806,559 | B2 | 10/2004 | Gann et al. |
| 6,809,367 | B2 | 10/2004 | Val |
| 2001/0000053 | A1 | 3/2001 | Suh et al. |
| 2001/0023980 | A1 | 9/2001 | Ohmori |
| 2002/0066952 | A1 | 6/2002 | Taniguchi et al. |
| 2002/0084520 | A1 | 7/2002 | Moden et al. |
| 2002/0096760 | A1 | 7/2002 | Simelgor et al. |
| 2002/0164838 | A1 | 11/2002 | Moon et al. |
| 2003/0042595 | A1 | 3/2003 | Canella |
| 2003/0059976 | A1 | 3/2003 | Nathan et al. |
| 2004/0099942 | A1 | 5/2004 | Jun et al. |
| 2006/0076671 | A1 | 4/2006 | Kariya et al. |

FOREIGN PATENT DOCUMENTS

| | | |
|---|---|---|
| FR | 2645681 | 10/1990 |
| JP | 2004-523902 | 8/2010 |
| WO | WO 01/59841 | 8/2001 |
| WO | WO-02/062118 | 8/2002 |

OTHER PUBLICATIONS

EP Communication for EP Application No. 03 721 978.9 dated Jul. 17, 2009.

Final Office Action for U.S. Appl. No. 10/968,572 mailed Jan. 28, 2010.

Final Office Action issued in U.S. Appl. No. 11/259,683 and mailed on Aug. 4, 2008.

Final Office Action issued in U.S. Appl. No. 12/562,803 and mailed on Sep. 8, 2010.

Non-final Office Action issued in U.S. Appl. No. 12/562,803 and mailed on Mar. 30, 2010.

Non-final Office Action issued in U.S. Appl. No. 10/968,572 and mailed on Apr. 11, 2007.

Non-final Office Action issued in U.S. Appl. No. 10/968,572 and mailed on Aug. 13, 2009.

Non-final Office Action issued in U.S. Appl. No. 10/968,572 and mailed on May 7, 2009.

Non-final Office Action issued in U.S. Appl. No. 11/259,683 and mailed on Jan. 2, 2008.

Non-final Office Action issued in U.S. Appl. No. 11/259,683 Sep. 18, 2009.

Notice of Allowance issued in U.S. Appl. No. 11/259,683 and mailed on Feb. 5, 2010.

Notice of Allowance issued in U.S. Appl. No. 10/968,572 and mailed Jun. 7, 2010.

Notice of Allowance issued in U.S. Appl. No. 11/259,683 and mailed on Apr. 27, 2009.

Office Action issued in Japanese Patent Application No. 2005-145904 and mailed on Jun. 7, 2010.

Restriction Requirement issued in U.S. Appl. No. 11/259,683 and mailed on Nov. 14, 2007.

European Search Report for Application No. 05111589.7 dated Dec. 20, 2007.

International Search Report for PCT/US03/13569 completed Jun. 19, 2003.

Final Office Action issued in U.S. Appl. No. 10/968,572 and mailed on Oct. 18, 2007.

Restriction Requirement issued in U.S. Appl. No. 10/968,572 and mailed on May 12, 2008.

Non-final Office Action issued in U.S. Appl. No. 10/968,572 and mailed on Sep. 10, 2008.

Advisory Action issued in U.S. Appl. No. 12/562,803 and mailed Dec. 10, 2010.

EP Communication issued in European Patent Application No. 03721978.9 and dated Sep. 30, 2010.

Examiner's Report issued in European Patent Application No. 05104103.6 and dated Sep. 1, 2010.

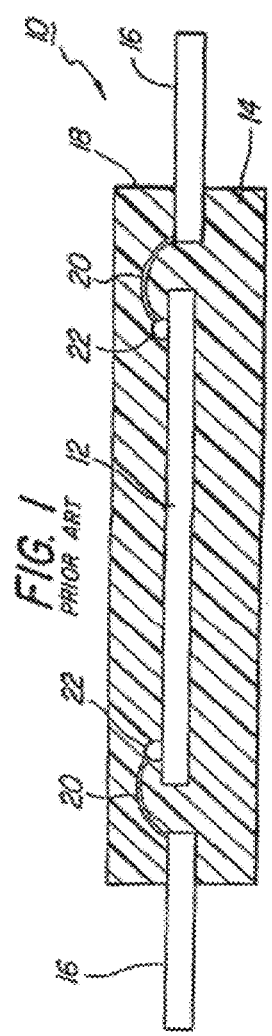
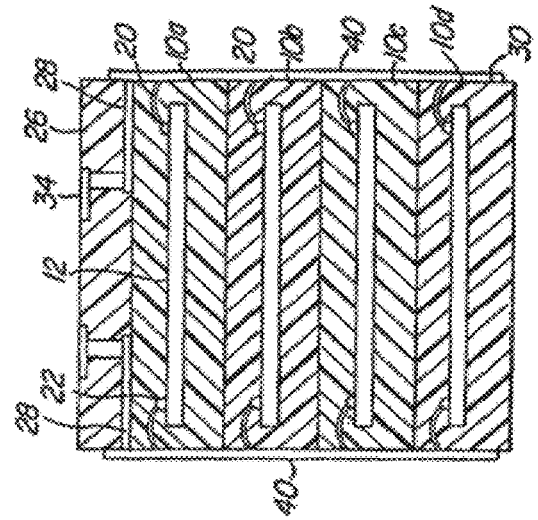
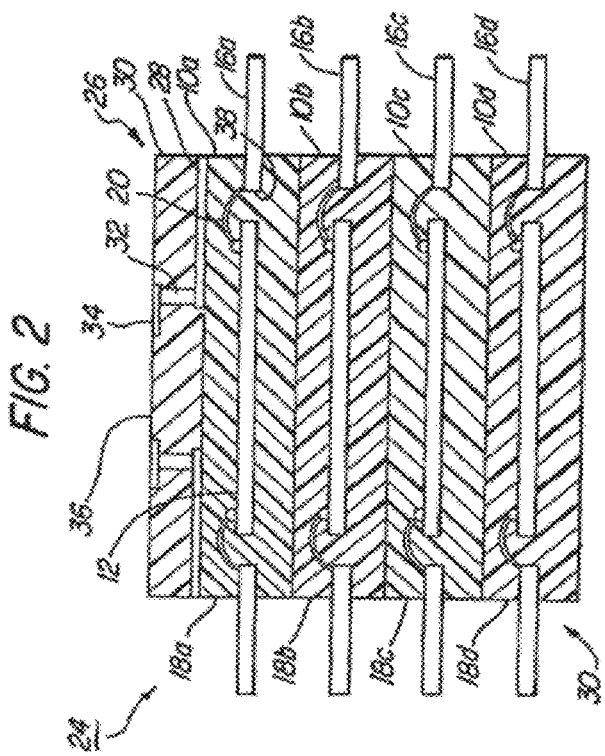

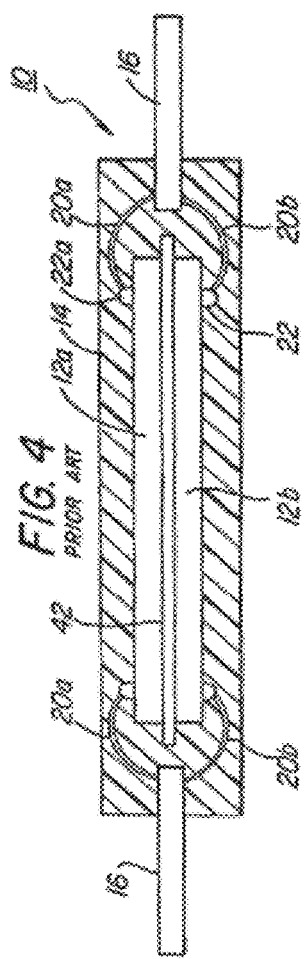
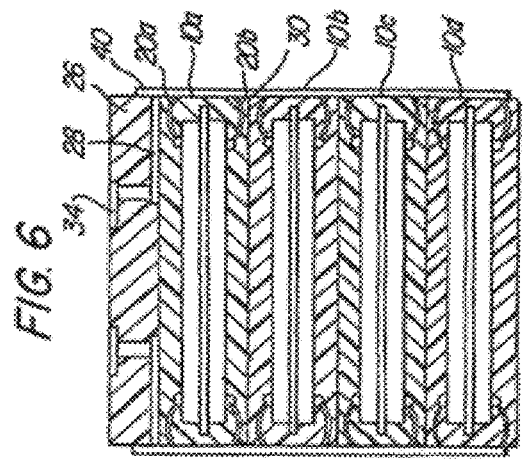
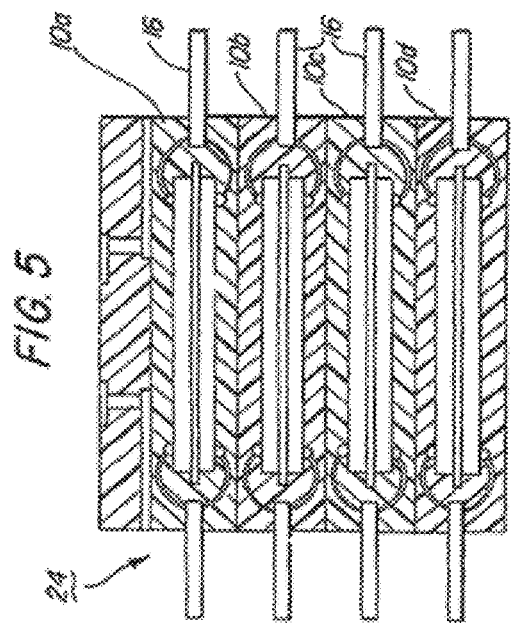

VERTICALLY STACKED PRE-PACKAGED INTEGRATED CIRCUIT CHIPS

CROSS-REFERENCE TO RELATED PATENT APPLICATIONS

This application is a Division of U.S. patent application Ser. No. 10/968,572, filed Oct. 19, 2004, which is a Continuation of U.S. patent application Ser. No. 10/128,728, filed Apr. 22, 2002. The disclosures of U.S. patent application Ser. No. 10/968,572 and U.S. patent application Ser. No. 10/128,728 are incorporated by reference herein in their entireties.

BACKGROUND

The invention relates to electronic modules comprised of stacked integrated circuit carrying chips and more particularly to the method and apparatus for providing a connection among and with memory chips as an assembly of stacked memory chips.

High-density electronic packages, which are capable of incorporating more electronic capacity in a given space, or reducing the space required for a given amount of electronic capacity. Such packages are particularly useful as computer memories, control logic, arithmetic units, and the like wherein a plurality of similar chips can be advantageous combined into a single assembly or module.

The electronic density is obtained by means of a structure in which integrated circuit (IC) chips are stacked to form a three-dimensional structure. The stacked chip structure: (a) has at least one interconnect plane which is adapted to be electrically connected to external circuitry; and (b) contains within its volume a very extensive electronic system. The term "interconnect plane" signifies that electrical leads extend to that planar surface of the stacked chip structure.

In various prior applications and patents assigned to the assignee of this application, stacks of silicon IC chips have been proposed. One of those applications is U.S. Pat. No. 4,706,166. That patent discloses a three-dimensional module of stacked layers, or chips, each of which layers carries IC circuits whose leads extend to a common interconnect plane of the module. Electrically conductive bumps deposited on the access plane of the module are aligned with, and bonded to, electrically conductive bumps on a supporting substrate, thereby connecting the circuitry in the stacked layers to external circuitry.

Various limitations and deficiencies in the prior developments have led to the present invention. One such limitation is the fact that IC chips, such as memory devices, which are preferably obtained as standard (off-the-shelf) items from suppliers, must be modified to provide external leads only at one edge, instead of two edges, of each chip.

Perhaps the most critical problems encountered have been due to the electrically conductive properties of the material of the stacked chips, except for such materials as gallium arsenide and sapphire. Because the electrical leads at the interconnect plane must be insulated from the semiconductor material, it has been necessary to apply passivation material on the interconnect plane, and then to form T-shaped electrical connections by applying thin-film metalization to the interconnect plane.

In the case of a silicon stack, the reliability of the "T-connects" depends largely on the quality of the passivation layer. Another problem centers around the epoxy glue between layers, which is troublesome in several ways. Glue thickness variations, for example, can cause problems during certain processing steps, and the glue limits the stack's operating temperature to about 10.degrees.C. It also limits the choice of material for the bonding bumps (to avoid degrading the glue and passivation due to high temperature). In addition to the "T-connect" problem and the glue problem, there is also a problem with flip-chip bonding (bump bonding) of the stacked chip module to a substrate. Flip-chip bonding has been less reliable as a method for making electrical interconnections than other methods, such as TAB bonding and wire bonding. In particular, it is not very practical in a mass production environment.

Another issue addressed by the present invention concerns heat transfer, particularly where the IC chips have high power requirements. Although silicon has reasonable heat-conducting properties, there is still the possibility of overheating problems in silicon stacks. Furthermore, the heat dissipation problem appears almost insurmountable (in stacked chip modules), if non-heat-conducting chips made of poor thermally-conducting material, such as gallium arsenide (GaAs), are used.

Such chips have certain advantages over silicon, including their ability to provide much higher speed electronic signals. However, the use of GaAs devices at higher speeds and temperatures, in the future can be expected to create packaging problems. As operating frequency increases into the gigahertz range, chip temperature increases and electrical/material properties begin to vary significantly. As a result, many other electrical properties are also affected; they include signal propagation delay, signal rise time, and characteristic impedances. Requirements for innovative denser packaging to help alleviate these problems have become critical. It is therefore obvious that special temperature considerations must be given to the packaging of GaAs devices to avoid degradation of their high-speed performance.

To satisfy these needs the prior art has provided a frame carrier in which the chip is embedded as shown in U.S. Pat. No. 4,764,846. While effective to meet the foregoing problems, this approach entails processing and manufacturing steps which add significantly to the cost of the assembled stack of chips.

Therefore, what is needed is an inexpensive and easily fabricated method and apparatus by which similar prefabricated, packaged chips may be stacked together and connected both to each other and to the external world.

SUMMARY

The invention is an apparatus comprising a plurality of prepackaged integrated circuits, each with a first plurality of exterior leads connected to a second plurality of interior wires, having at least one exterior lead which is not connected to any interior wire. The plurality of prepackaged integrated circuits are vertically stacked on each other so that like leads are aligned with each. The prepackaged integrated circuits are modified so that the first plurality of exterior leads are removed exposing ends of the second plurality of interior wires on a collective lateral surface of the vertically stacked prepackaged integrated circuits. A plurality of metalizations are disposed on the collective lateral surface connecting selected ones of the second plurality of interior wires together and separately connected to selected other ones of second plurality of interior wires.

The apparatus further comprises a contact layer having contact pads defined therein. The contact layer is disposed on the vertically stacked prepackaged integrated circuits. The plurality of metalizations are coupled to the contact pads. The plurality of metalizations are coupled to the contact pads via leads disposed in the contact layer and extending to the collective lateral surface. The contact layer has an exposed top surface and the contact pads are defined on the exposed top surface.

The apparatus of claim 2 wherein the contact layer has an exposed top surface and wherein the contact pads are defined on the exposed top surface.

The prepackaged integrated circuits have a plurality of types of circuit terminals. A first group of metalizations, which connect selected ones of the second plurality of interior or bonding wires together, are disposed vertically on the collective lateral surface and are connected to a selected one of the types of circuit terminals of each of the plurality of prepackaged integrated circuits to form a common connection among the selected type of circuit terminal. A second group of metalizations, which are separately connected to a selected one of second plurality of interior or bonding wires, correspond to a selected type of circuit terminal for each of the plurality of prepackaged integrated circuits. This second group of metalizations are disposed in part vertically on the collective lateral surface and are laterally offset one from the other to allow separate access to each one of the plurality of prepackaged integrated circuits through the selected type of circuit terminal.

This second group of offset metalizations are disposed in an NC or "no connection" region of the collective lateral surface. The collective lateral surface created when the first plurality of exterior leads are removed, i.e. NC or "no connection" region, includes an insulative surface devoid of any exposed ends of the interior wires. The plurality of metalizations which are separately connected to selected other ones of second plurality of interior wires are disposed at least in part thereon.

In the illustrated embodiment the plurality of prepackaged integrated circuits comprise a plurality of memory circuits. The selected ones of the second plurality of interior wires which are coupled together to the metalization include power terminals. The second plurality of interior wires separately connected to the metalization include chip control or data input/output terminals.

The invention is also characterized as a method for making the above-described apparatus.

While the apparatus and method has or will be described for the sake of grammatical fluidity with functional explanations, it is to be expressly understood that the claims, unless expressly formulated under 35 U.S.C. §112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. §112 are to be accorded full statutory equivalents under 35 U.S.C. §112. The invention can be better visualized by turning now to the following drawings wherein like elements are referenced by like numerals.

BRIEF DESCRIPTION OF THE DRAWINGS

FIG. 1 is a side cross-sectional view of a prepackaged chip devised according to the prior art.

FIG. 2 is a side cross-sectional view of a plurality of prepackaged chips of FIG. 1 vertically stacked according to the invention.

FIG. 3 is a side cross-sectional view of a plurality of prepackaged chips of FIG. 2 which have been modified to remove the lead frames according to the invention.

FIG. 4 is a side cross-sectional view of a prepackaged chip devised according to the prior art in which there are two back-to-back chips within the same package.

FIG. 5 is a side cross-sectional view of a plurality of prepackaged chips of FIG. 4 vertically stacked according to the invention.

FIG. 6 is a side cross-sectional view of a plurality of prepackaged chips of FIG. 5 which have been modified to remove the lead frames according to the invention.

Figure 7:
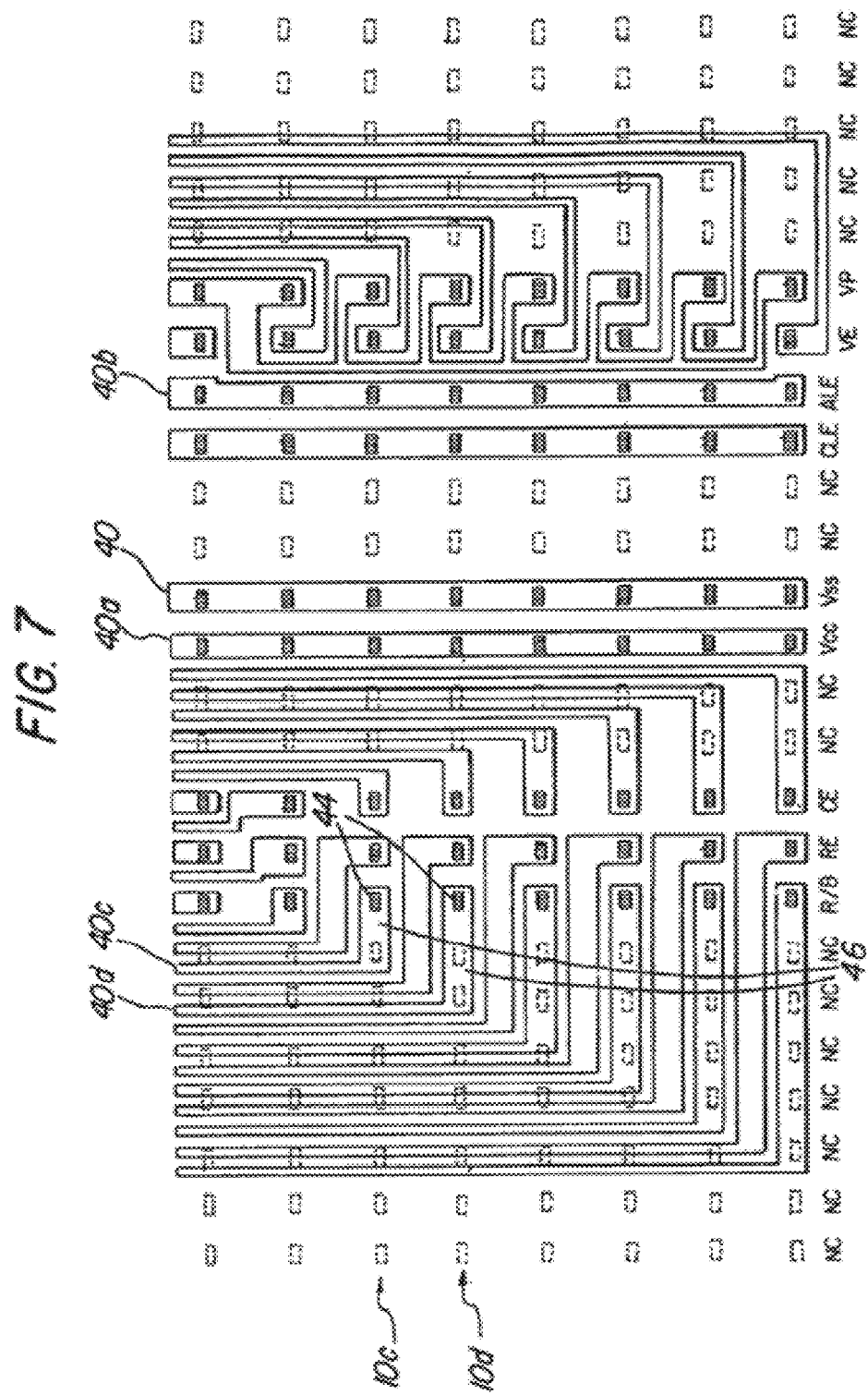
FIG. 7 is a plan view of the side metalizations disposed on the collective lateral surface of the stack in either the embodiments of FIG. 3 or 6.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION

A plurality of identical prepackaged chips, such a memory chips, are vertically stacked and bonded together with their terminals aligned. The exterior lead frames are removed by grinding down the collective lateral surface of the stack, including that portion of the exterior lead frames extending into the packaging of the chip. The bonding wires which were connected to the lead frames are now exposed on the collective lateral surface of the stack. In those areas collective lateral surface of the stack where no bonding wire was connected to the lead frame, a bare insulative surface is left.

A contact layer is disposed on top of the stack and vertical metalizations defined on the stack to connect the ends of the wires to the contact layer and hence to contact pads on the top surface of the contact layer. The vertical metalizations are arranged and configured on the collective lateral surface of the stack to connect all commonly shared terminals of the chips, such a power and ground terminals to a single vertical metalization, while the control and data input/output signals of each chip are separately connected to offset vertical metalizations defined on the collective lateral surface, which metalizations are disposed in part on the bare insulative surface portions of the collective lateral surface.

FIG. 1 is a side cross-sectional view of a conventional integrated circuit chip, such as a flash memory chip 10. The packaged memory chip 10 is comprised of a semiconductor integrated chip, symbolically denoted by reference numeral 12 included within a passivating package 14, such as molded plastic. Chip 12 is connected to a conductive lead assembly 16 which electrically communicates chip 10 to the exterior world and extends into the side surface 18 of packaging 14. Wire bonded leads 20 connect lead frame 16 to connection points 22 on chip 12. In this manner chip 10 is encapsulated or passivated from the exterior environment while providing the required number of electrical connections typically through a dual-in-line package.

Thus, FIG. 1 represents an integrated circuit memory chip 10 as it is typically provided by the manufacturer. A plurality of such chips 10 can be vertically stacked together according to the invention as depicted in FIG. 2. In the illustrated embodiment of FIG. 2 four such chips 10a, 10b, 10c and 10d are shown as vertically stacked one on top of each other. Any number of such chips may be vertically stacked and only four chips are shown only for the purposes of illustration. Chips 10a-10d are bonded together by adhesive or any other equivalent means now known or later devised.

As depicted in FIG. 2, corresponding lead frame's 16a-16d extent from side surface 18a-18d which side surface is collectively defines the side surface of the stack denoted by reference numeral 24 in FIG. 2. While the illustrated embodiment shows a dual-in-line lead frame 16, it is to be expressly understood that any kind of connection device now known or later devised for providing electrical access into the chip may be equivalently substituted.

A top connection player, generally denoted by reference numeral 26, is disposed on the top surface of the uppermost chip 10a. Contact layer 26 as a plurality of side leads 28 defined therein which extend to side surface 30 in a manner which will be described in greater detail below. Leads 28 then connect to vertical vias 32 defined within layer 26, which in turn are connected to contact pads 34 defined on the upper surface 36 of layer 26. The manufacture of contact layer 26 is conventional and may include known or later discovered semiconductor lithographic and/or printed circuit board manufacturing techniques. For example, contact layer 26 may be comprised of an insulating printed circuit board substrate in which metallic or conductive leads 28, vias 32 and contact pads 34 have been conventional defined or formed. Contact layer 26 is then conventionally bonded to the top of the stack of chips 10.

FIG. 3 is a side cross-sectional view of assembly 24 as shown in FIG. 2 after the lateral side portions of assembly 24 have been removed by grinding or any other equivalent means now known or later devised. This operation removes the extending portions of lead frames 16a-16d and portions of packaging 14 of each of the chips 10a-10d to the interior end 38 of lead frames 16a-16d. This leaves only a cross-sectional end portion of bonding wire 20 exposed on side 30 of assembly 24. To the extent then that each of the bonding wires 20 are connected to common contact points 22 within chips 10a-10d, wires 20 can be coupled by means of defined metalizations 40 which are lithographically disposed on side surfaces 30 of assembly 24. Metalizations 40 are directed vertically upwardly and downwardly along sides 30 to contact leads 28 exposed on the side surface is 30 of layer 26. In this manner, contact points 22 within chips 10a-10d are appropriately connected to contact pads 34 defined on the upper surface of layer 26.

Similarly, chips 10 which include two back-to-back integrated circuits 12a and 12b within a single packaging 14 as shown in the side cross-sectional view of FIG. 4 may be similarly stacked and interconnected. As shown in the side cross-sectional view in FIG. 4 chips 12a and 12b are separated by an interposer layer 42, but are otherwise identical in construction to the chip shown in FIG. 1. Chips 12a and 12b are connected to by their corresponding bonding wires 20a and 20b to a shared to lead frame 16. In this manner, the amount of memory, for example, included within chip 10 may be doubled without doubling the number of exterior leads connected to package 14. While the interior wires 20a and 20b are shown in the illustrated embodiment as conventional bonding wires, any electrical connection used or capable of being used to connect an exterior terminal to a semiconductor chip now know or later devised may be equivalently substituted.

Again, a plurality of chips 10a-10d can be stacked as shown in FIG. 5 using the double chip embodiment of FIG. 4. In the same manner as described in connection with FIGS. 2 and 3, the stacked assembly 24 of FIG. 5 can be processed so that lead frames 16 are removed and contacts are then made on the lateral side surface 30 of assembly 24 with bonding wires 20a and 20b of chips 10a-10d. Connection is again made through vertical metalizations 40 to leads 28 and hence contact pads 34 on upper layer 26.

FIG. 7 is a diagrammatic plan view of lateral surface 30 of assembly 24 which illustrates the general principle by which side metalizations 40 may be used to connect the plurality of chips 10. In a typical integrated circuit chip 10 one or more leads within lead frame 16 will be unconnected or dummy leads, that is, leads which are designated as no connection leads, NC. Only certain ones of the leads will be connected to active circuit or contact points 22 within chips 12. For example in a memory, these active leads will include data input and outputs I/O as well as command signals such as: address latch enable, ALE; chip enable, CE; read enable, RE; write enable, WE; power, VCC; ground, VSS and similar control signals or shared circuit terminals. Since chips 10a-10d are vertically stacked and aligned with each other, similar leads will be vertically positioned above corresponding leads in adjacent chips. For example as shown in FIG. 7 in the vertical line connected to metalizations 40a will be all of the power connect leads VCC for each of the chips with an assembly 24. Similarly connected to vertical metalization 40b shown in FIG. 7, will be all of the addressed latch enable ALE contacts within chips 10 in assembly 24. However, since each of the chips 10a-10d must be separately accessed with respect to various ones of the other input and output data terminals, the separate metalizations 40c are defined on side surface 30 to connect, for example, to a ready/busy R/B terminal 44 in chip 10c.

The corresponding ready/busy R/B terminal 44 the next lower chip 10d will then be provided with the separate metalizations 40d. Metalizations 40c and 40d as shown in FIG. 7 include an all lateral portions 46 which extend horizontally across side surface 30 until a region is reached on side surface 30 which has space available for the vertical run of the corresponding metalizations 40c or 40d. Space is available on side surface 30 for such offset vertical runs of lines 40c and 40d and other metalizations similar thereto by reason of the plurality of adjacent no connection terminals, NC, provided in a typical integrated memory chip 10. The removal step between FIGS. 2 and 3 or FIGS. 5 and 6 remove all the metal contact of lead frame 16 which is normally positioned in the "NC" region of lead frames 16. This leaves then bare passivation of packaging 14 as the exposed side surface 30. No end contacts of wires 20 are provided to adjacent an NC lead and hence the insulated surface 30 is available for deposition of metalizations 40 without interference.

FIG. 7 is a diagrammatic depiction of an actual assembly 24 of flash memory chips which illustrates that the number of NC connections are sufficient and spaced appropriately to allow ample surface on the side surface 30 for both the commonly shared metalizations 40a and nonshared or chip specific metalizations such as 40d and 40c. It is to be expressly understood that the geometric pattern of NC regions and active wire ends shown in FIG. 7 is illustrative only of one specific memory chip and that the pattern will vary with each prepackaged chip design. However, the principles of the invention are generally applicable to any geometric configuration that might be presented. For example, while NC regions are beneficially utilized, it is also to be understood that the area of the collective lateral side surface of the stack between normally spaced active terminals can be considered as equivalent to an NC region and used for metalizations of a more narrow width down to the limits of reliable manufacturing line width rules.

It is also to be contemplated as being within the scope of the invention that the metalizations disposed on the collective lateral side surface of the stack may be multilayered with intervening insulating layers between the multiple conductive lines with connecting vias to the terminals, if desired or necessary.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense, it is therefore contemplated that an equivalent substitution of two or more elements may be made for anyone of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

What is claimed is:

1. A method comprising:
    providing a plurality of prepackaged integrated circuits (ICs), each including an interior wire having a length that extends between a contact within the prepackaged IC and a lateral surface of the prepackaged IC, wherein each interior wire is entirely enclosed by a passivating package of the prepackaged IC along the length of the interior wire;
    stacking the plurality of prepackaged ICs to align corresponding lateral surfaces of the plurality of prepackaged ICs;
    modifying the plurality of prepackaged ICs to expose at least some of the interior wires such that the at least some of the interior wires terminate at a lateral surface of the stacked plurality of prepackaged ICs; and
    disposing a plurality of metallization structures on the lateral surfaces of the plurality of prepackaged ICs, wherein the metallization structures are configured to electrically connect the respective prepackaged ICs.

2. The method of claim 1, wherein the plurality of prepackaged ICs comprises a plurality of thin small-outline packages.

3. The method of claim 1, further comprising electrically connecting a contact pad of a contact layer to at least one of the plurality of metallization structures.

4. The method of claim 3, wherein the contact layer is disposed on an uppermost prepackaged IC of the plurality of prepackaged ICs.

5. The method of claim 3, wherein the contact layer comprises a side lead extending to a lateral surface of the contact layer, and wherein said electrically connecting a contact layer to at least one of the plurality of metallization structures comprises electrically connecting the side lead to the at least one of the plurality of metallization structures and to the contact pad.

6. The method of claim 5, wherein said electrically connecting the side lead to the at least one of the plurality of metallization structures and to the contact pad comprises electrically connecting the side lead to the contact pad by a via formed in the contact layer.

7. The method of claim 3, wherein the contact pad is disposed on an exposed upper surface of the contact layer.

8. The method of claim 1, wherein the plurality of prepackaged ICs comprises a plurality of circuit terminals.

9. The method of claim 8, further comprising electrically connecting the plurality of circuit terminals with a first metallization structure of the plurality of metallization structures.

10. The method of claim 1, wherein said disposing a plurality of metallization structures on the lateral surfaces of the plurality of prepackaged ICs comprises disposing the plurality of metallization structures on the lateral surfaces such that the plurality of metallization structures extend vertically along the stacked plurality of prepackaged ICs.

11. The method of claim 1, wherein said disposing a plurality of metallization structures on the lateral surfaces of the plurality of prepackaged ICs comprises:
    offsetting a first metallization structure of the plurality of metallization structures from a second metallization structure of the plurality of metallization structures; and
    disposing the first metallization structure, at least in part, over a lead that is not connected to a contact or an active circuit.

12. The method of claim 1, wherein the plurality of prepackaged ICs comprises a plurality of memory chips.

13. The method of claim 1, further comprising:
    electrically connecting a plurality of power terminals by a first metallization structure of the plurality of metallization structures; and
    electrically connecting a plurality of control or input/output terminals by a second metallization structure of the plurality of metallization structures.

14. The method of claim 1, wherein at least one of the passivating packages is a molded plastic.

15. The method of claim 1, further comprising bonding the plurality of prepackaged ICs together using an adhesive.

16. The method of claim 1, wherein at least one of the plurality of prepackaged ICs comprises an IC chip disposed within and entirely surrounded by the passivating package of the respective prepackaged IC.

17. A method comprising:
- stacking a first prepackaged integrated circuit (IC) on a second prepackaged IC to align a first lateral surface of the first prepackaged IC with a second lateral surface of the second prepackaged IC, wherein the first prepackaged IC includes a first interior wire that is entirely enclosed by a first passivating package along its length and extends between a connection point within the first prepackaged IC and the first lateral surface, and wherein the second prepackaged IC includes a second interior wire that is entirely enclosed by a second passivating package along its length and extends between a connection point within the second prepackaged IC and the second lateral surface;
- modifying the first and second prepackaged ICs to expose the first and second interior wires; and
- disposing a metallization structure on the first and second lateral surfaces that is configured to electrically connect the first prepackaged IC to the second prepackaged IC.

18. The method of claim 17, wherein at least one of the first or second prepackaged ICs comprises a thin small-outline package.

19. The method of claim 17, further comprising electrically connecting a contact pad of a contact layer to the metallization structure.

20. The method of claim 19, wherein the contact layer is disposed on an uppermost prepackaged IC of the first prepackaged IC or the second prepackaged IC.

21. The method of claim 19, wherein the contact layer comprises a side lead extending to a lateral surface of the contact layer, and wherein the side lead is electrically connected to at least one of the first or second prepackaged ICs and to the contact pad.

22. The method of claim 21, further comprising electrically connecting the side lead to the contact pad by a via formed in the contact layer.

23. The method of claim 19, wherein the contact pad is disposed on an exposed upper surface of the contact layer.

24. The method of claim 17, wherein the first and second prepackaged ICs comprise a plurality of circuit terminals.

25. The method of claim 24, further comprising electrically connecting the plurality of circuit terminals to the metallization structure.

26. The method of claim 17, wherein said disposing a metallization structure on the first and second lateral surfaces comprises disposing the metallization structure such that the metallization structure extends vertically along the first and second lateral surfaces.

27. The method of claim 17, wherein said disposing a metallization structure on the first and second lateral surfaces comprises offsetting the metallization structure from another metallization structure and disposing the metallization structure, at least in part, over a no-connection terminal.

28. The method of claim 17, wherein at least one of the first or second prepackaged ICs is a memory chip.

29. The method of claim 17, further comprising:
- electrically connecting the metallization structure to a plurality of power terminals disposed on the first and second prepackaged ICs; and
- electrically connecting another metallization structure to a plurality of control or input/output terminals disposed on the first and second prepackaged ICs.

30. The method of claim 17, wherein at least one of the first or second passivating packages is a molded plastic.

31. The method of claim 17, further comprising adhering the first prepackaged IC to the second prepackaged IC with an adhesive.

32. The method of claim 17, wherein the first prepackaged IC comprises an IC chip disposed within and entirely surrounded by the first passivating package of the first prepackaged IC.

33. A method comprising:
- stacking a first prepackaged integrated circuit (IC) on a second prepackaged IC to align a first lateral surface of the first prepackaged IC with a second lateral surface of the second prepackaged IC, wherein the first prepackaged IC includes a first interior wire having a first length that extends between a connection point within the first prepackaged IC and the first lateral surface, wherein the first interior wire is entirely enclosed by a first passivating package of the first prepackaged IC along the first length of the first interior wire, wherein the second prepackaged IC includes a second interior wire having a second length that extends between a connection point within the second prepackaged IC and the second lateral surface, and wherein the second interior wire is entirely enclosed by a second passivating package of the second prepackaged IC along the second length of the second interior wire;
- stacking a contact layer on the first prepackaged IC such that a third lateral surface of the contact layer is aligned with the first lateral surface of the first IC package, wherein the contact layer includes a contact pad;
- modifying the first and second prepackaged ICs to expose the first and second interior wires; and
- disposing a metallization structure on the first and second lateral surfaces, wherein the metallization structure is configured to electrically connect the first interior wire, the second interior wire, and the contact pad.

34. The method of claim 33, wherein the contact layer further comprises a side lead extending to the third lateral surface of the contact layer, the method further comprising electrically connecting the side lead to the metallization structure.

35. The method of claim 34, wherein said electrically connecting the side lead to the metallization structure comprises electrically connecting the side lead to the contact pad through a via formed in the contact layer.

36. The method of claim 33, wherein the first interior wire and the second interior wire are electrically connected to same-type circuit terminals.

* * * * *